United States Patent
Long et al.

(10) Patent No.: US 10,748,864 B2
(45) Date of Patent: Aug. 18, 2020

(54) BONDED SEMICONDUCTOR PACKAGE AND RELATED METHODS

(71) Applicant: SEMICONDUCTOR COMPONENTS INDUSTRIES, LLC, Phoenix, AZ (US)

(72) Inventors: Thomas Fairfax Long, Gresham, OR (US); Jeffrey Peter Gambino, Portland, OR (US); Charles Alvah Hill, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 394 days.

(21) Appl. No.: 15/285,824

(22) Filed: Oct. 5, 2016

(65) Prior Publication Data
US 2018/0096988 A1    Apr. 5, 2018

(51) Int. Cl.
*H01L 23/00* (2006.01)
*H01L 23/31* (2006.01)

(52) U.S. Cl.
CPC .......... *H01L 24/17* (2013.01); *H01L 23/3157* (2013.01); *H01L 24/11* (2013.01);
(Continued)

(58) Field of Classification Search
CPC ..................... H01L 24/17; H01L 24/25; H01L 2224/13015; H01L 2224/13018;
(Continued)

(56) References Cited

U.S. PATENT DOCUMENTS

| | | | |
|---|---|---|---|
| 9,583,451 B2* | 2/2017 | Arvin | H01L 24/11 |
| 2002/0084565 A1* | 7/2002 | Dautartas | G02B 6/4204 |
| | | | 269/289 R |
| 2014/0252604 A1* | 9/2014 | Motoyoshi | H01L 24/11 |
| | | | 257/737 |

OTHER PUBLICATIONS

Tung Thanh Bui, et. al., "Modified Thermosonic Flip-Chip Bonding based on Electroplated Cu Microbumps and Concave Pads for High-precision Low-temperature Assembly Applications," 2013 Electronics Components & Technology Conference, IEEE, 2013, available online at http://ieeexplore.ieee.org/document/6575606/?reload=true&arnumber=6575606.

(Continued)

*Primary Examiner* — Zandra V Smith
*Assistant Examiner* — Abbigale A Boyle
(74) *Attorney, Agent, or Firm* — Adam R. Stephenson, Ltd.

(57) ABSTRACT

Implementations of a semiconductor package may include: a first wafer having a first surface and a first set of blade interconnects, the first set of blade interconnects extending from the first surface. The package may include a second wafer having a first surface and a second set of blade interconnects, the second set of blade interconnects extending from the first surface and oriented substantially perpendicularly to a direction of orientation of the first set of blade interconnects. The first set of blade interconnects may be hybrid bonded to the second set of blade interconnects at a plurality of points of intersection between the first and second set of blade interconnects. The plurality of points of intersection may be located along a length of each blade interconnect of the first set of blade interconnects, and along the length of each blade interconnect of the second set of blade interconnects.

20 Claims, 7 Drawing Sheets

(52) U.S. Cl.
CPC .............. *H01L 24/13* (2013.01); *H01L 24/16* (2013.01); *H01L 24/25* (2013.01); *H01L 24/81* (2013.01); *H01L 24/94* (2013.01); *H01L 2224/11462* (2013.01); *H01L 2224/11472* (2013.01); *H01L 2224/13005* (2013.01); *H01L 2224/13012* (2013.01); *H01L 2224/13013* (2013.01); *H01L 2224/13015* (2013.01); *H01L 2224/13017* (2013.01); *H01L 2224/13019* (2013.01); *H01L 2224/13082* (2013.01); *H01L 2224/14131* (2013.01); *H01L 2224/1607* (2013.01); *H01L 2224/16056* (2013.01); *H01L 2224/16105* (2013.01); *H01L 2224/2919* (2013.01); *H01L 2224/73104* (2013.01); *H01L 2224/81141* (2013.01); *H01L 2224/81193* (2013.01); *H01L 2224/81203* (2013.01); *H01L 2224/83191* (2013.01); *H01L 2224/83193* (2013.01); *H01L 2224/94* (2013.01)

(58) Field of Classification Search
CPC . H01L 2224/13019; H01L 2224/14051; H01L 2224/17051; H01L 2224/10135
See application file for complete search history.

(56) References Cited

OTHER PUBLICATIONS

Amran Eitan, et. al., "Thermo-compression Bonding for Fine-pitch Copper-pillar Flip-chip Interconnect-Tool Feature as Enablers of Unique Technology," 2015 Electronics components & Technology Conference, IEEE, 2015, available online at http://ieeexplore.ieee.org/document/7159631/.

P. Enquist, et. al., "Low Cost of Ownership Scalable Copper Direct Bond Interconnect 3D IC Technology for Three Dimensional Integrated Circuit Applications," IEEE International Conference on 3D System Integration, IEEE, Sep. 2009, available online at http://ieeexplore.ieee.org/document/5306533/.

"IFTLE 24 NAPS National Summary Part 1-3D Highlights," published online by Solid State Technology Nov. 20, 2010, last accessed Mar. 24, 2016 at http://electroiq.com/insights-from-leading-edge/2010/11/iftle-24-imaps-national-summary-part-1-3d-highlights/.

John Drab, "Multilevel Wafer Stacking for 3D circuit Integration," Raytheon Technology Today, Issue 1, 2015, available at www.raytheon.com.

Tzu-Ying Kuo, et. al., "Reliability Tests for a Three Dimensional chip Stacking Structure with Through Silicon via connections and Low Cost," 2008 Electronic Components and Technology Conference, IEEE, May 2008, available online at http://ieeexplore.ieee.org/document/4550076/.

Masaki Ohyama, "Hybrid Bonding of Cu/Sn Microbump and Adhesive with Silica Filler for 3D Interconnection of Single Micron Pitch," 2015 Electronic and Components & Technology Conference, IEEE, May 2015, available online at http://ieeexplore.ieee.org/document/7159612/.

Sung K. Kang, "Recent Progress in Lead (Pb)-Free Solders and Soldering Technology," Workshop on Pb-Free Solders, UCLA, Sep. 2002, available online at http://www.seas.ucla.edu/ethinfilm/Pb-freeWorkshop/pdf/kang.pdf.

\* cited by examiner

BONDED SEMICONDUCTOR PACKAGE AND RELATED METHODS

BACKGROUND

1. Technical Field

Aspects of this document relate generally to semiconductor packages. More specific implementations involve bonded wafers for semiconductor packages.

2. Background

Three dimensional vertical connections within semiconductor packages have been utilized to facilitate the stacking of wafers in an integrated circuit. Conventionally, these have taken the form of through silicon vias (TSV) or through oxide vias (TOV). Bonding of two wafers together usually takes place through either hybrid bonding where the materials at the bonding layer are not all the same material, or through fusion bonding, where the materials bonded on each wafer are the same material.

SUMMARY

Implementations of a semiconductor package may include: a first wafer having a first surface and a first set of blade interconnects coupled to the first surface of the first wafer, the first set of blade interconnects extending from the first surface. The package may include a second wafer having a first surface and a second set of blade interconnects coupled to the first surface of the second wafer, the second set of blade interconnects extending from the first surface and oriented substantially perpendicularly to a direction of orientation of the first set of blade interconnects. The first set of blade interconnects may be hybrid bonded to the second set of blade interconnects at a plurality of points of intersection between the first set and second set of blade interconnects. The plurality of points of intersection may be located along a length of each blade interconnect of the first set of blade interconnects, and may be located along the length of each blade interconnect of the second set of blade interconnects.

Implementations of a semiconductor package may include one, all, or any of the following:

The first set of blade interconnects and the second set of blade interconnects may include a metal or a metal alloy.

The first set of blade interconnects and the second set of blade interconnects may include a solder layer thereon.

The semiconductor package may include an underfill material disposed between the blade interconnects of the first set of blade interconnects.

The semiconductor package may include an underfill material disposed between the blade interconnects of the second set of blade interconnects.

Each blade interconnect of the first set of blade interconnects and of the second set of blade interconnects may have a first sidewall and a second sidewall opposite a first sidewall. The first sidewall may have an angle from the first surface of one of the first wafer and the second wafer of between 90 degrees and 170 degrees and the second sidewall may have an angle from the first surface of one of the first wafer and the second wafer of between 90 degrees and 170 degrees.

At least one blade interconnect of the first set of blade interconnects may not be the same size as the other blade interconnects of the first set of blade interconnects.

At least one blade interconnect of the second set of blade interconnects may not be the same size as the other blade interconnects of the second set of blade interconnects.

Not every blade interconnect of the first set of blade interconnects may have a corresponding blade interconnect of the second set of blade interconnects.

Implementations of a semiconductor package may include: a first wafer having a first surface and a first set of blade interconnects coupled to the first surface of the first wafer, the first set of blade interconnects extending from the first surface. The package may also include a second wafer having a first surface, a second set of blade interconnects coupled to the first surface of the second wafer, the second set of blade interconnects extending from the first surface and oriented substantially perpendicularly to a direction of orientation of the first set of blade interconnects. Each blade interconnect of the second set of blade interconnects may have a chamfer therein. The first set of blade interconnects may be hybrid bonded to the second set of blade interconnects at a plurality of points of intersection between the first set of blade interconnects and the chamfer of each blade of the second set of blade interconnects. The plurality of points of intersection may be located along a length of each blade interconnect of the first set of blade interconnects, and may be located within the chamfer of each blade interconnect of the second set of blade interconnects.

Implementations of a semiconductor package may include one, all, or any of the following:

The first set of blade interconnects and the second set of blade interconnects may include a metal or a metal alloy.

The first set of blade interconnects and the second set of blade interconnects may include a solder layer thereon.

The semiconductor package may include an underfill material disposed between the blade interconnects of the first set of blade interconnects and an underfill disposed between the blade interconnects of the second set of blade interconnects.

Each blade interconnect of the first set of blade interconnects and of the second set of blade interconnects may have a first sidewall and a second sidewall opposite a first sidewall. The first sidewall may have an angle from the first surface of one of the first wafer and the second wafer of between 90 degrees and 170 degrees and the second sidewall may have an angle from the first surface of one of the first wafer and the second wafer of between 90 degrees and 170 degrees.

At least one blade interconnect of the first set of blade interconnects may not be the same size as the other blade interconnects of the first set of blade interconnects.

At least one blade interconnect of the second set of blade interconnects may not be the same size as the other blade interconnects of the second set of blade interconnects. Not every blade interconnect of the first set of blade interconnects may have a corresponding blade interconnect of the second set of blade interconnects.

Implementations of a semiconductor package may be formed using implementations of a method of making a semiconductor package. The method may include forming an undercut photo photoresist pattern in a photoresist layer on one of a first surface of a first wafer and on a first surface of a second wafer, where the undercut photoresist layer, when viewed from above a cross sectional view of the photoresist pattern, has one of two opposing triangles in the photoresist layer and an hourglass shape in the photoresist layer. A metal may be electroplated into the undercut photoresist pattern. A chamfer may be formed in the blade interconnect during electroplating using the one of two opposing triangles and the hourglass shape of the photoresist pattern and the photoresist is removed to form a blade interconnect.

Implementations of a method of forming a semiconductor package may include one, all, or any of the following:

The undercut photoresist pattern may have one of where the two opposing triangles have rounded vertices and the hourglass shape has rounded edges.

A metal seed layer may be deposited between the first surface of the first wafer and the photoresist pattern. The metal seed layer may be etched away after electroplating the metal into the undercut photoresist pattern.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

While the various implementations disclosed in this document focus on two wafer stacking, it is fully appreciated that the principles disclosed herein may be used for die-to-die stacking of two or more die, die to wafer stacking of two or more die on top of one wafer, and wafer to wafer stacking of more than two wafers.

Figure 1:
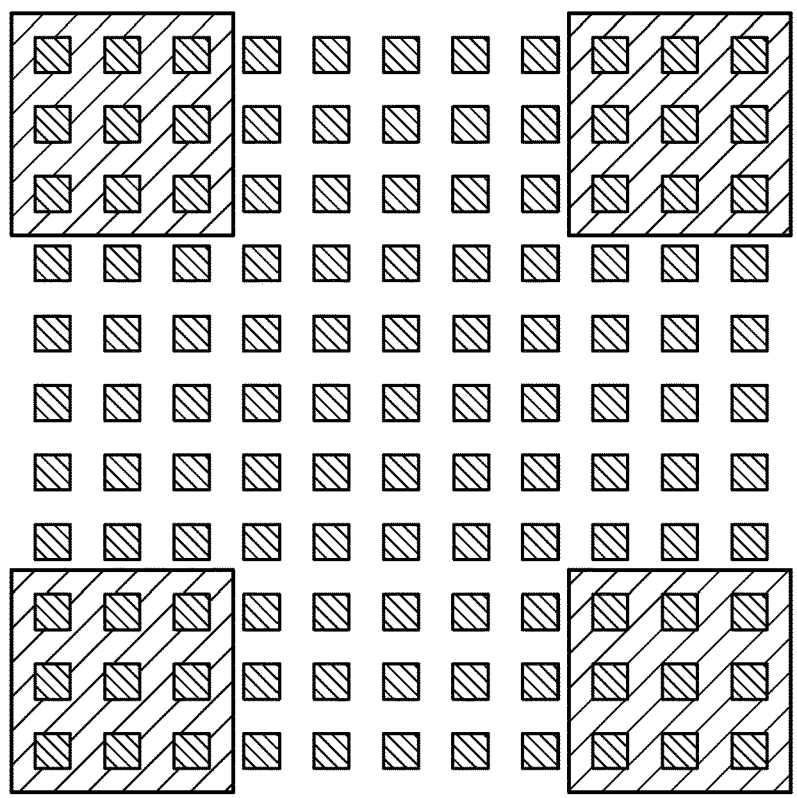
FIG. 1 is a view of a layout of an ideal array of bond pads.

FIG. 1 illustrates a top view of a layout of an ideal array of bond pads on a wafer surface. In the drawing, this set of bond pads may correspond with a single die, or an array of die on an entire wafer. Ideally the bond pads are all equally spaced with minimal spacing in between the bond pads. When arranged in this way, the bond pads provide a uniformly dense pattern, which increases uniformity during various processing steps and also eliminates extra space between die in the array, thus maximizing the die per wafer.

Figure 2:
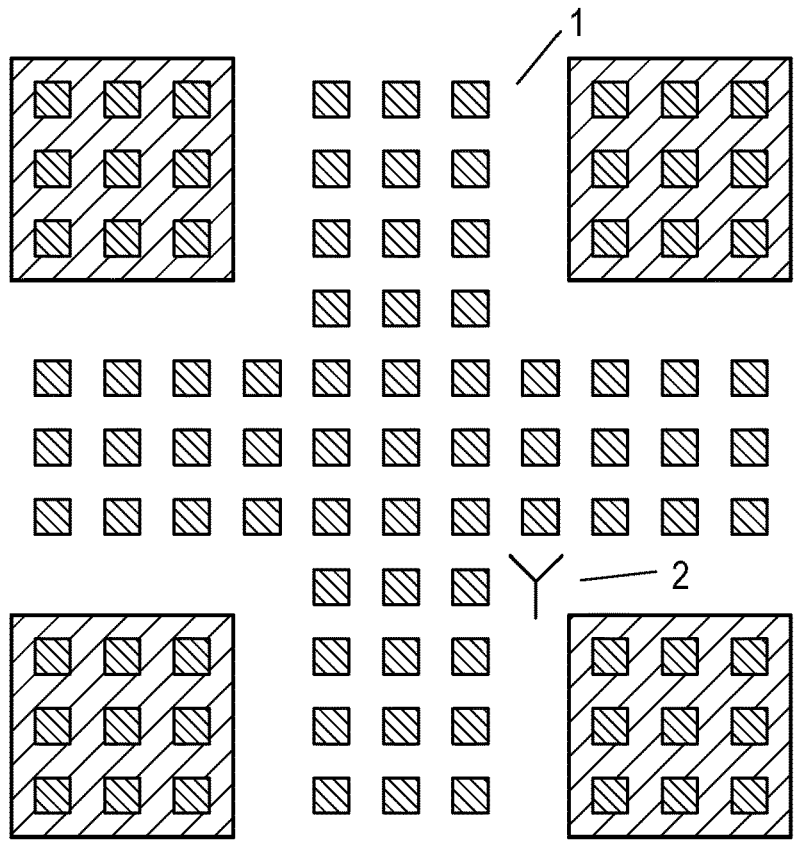
FIG. 2 is a view of a layout of conventional bond pads with open spaces used for alignment structures.

FIG. 2 illustrates a layout of a conventional bond pad array with blank space 1 required for alignment structures. Though FIG. 1 represents an ideal layout, FIG. 2 represents an example of an actual layout used in conventional devices. Historically the blank space 1 has been required to allow for placement of alignment structures 2 in the space. The alignment structures 2 are used by the bonding equipment to create proper alignment of the wafers prior to the bonding process being carried out. However, the presence of the blank space 1 leads to incomplete bonding between the wafers, particularly when hybrid bonding is being employed, as it reduces the surface area of material that can be used to form the bond.

Figure 3:
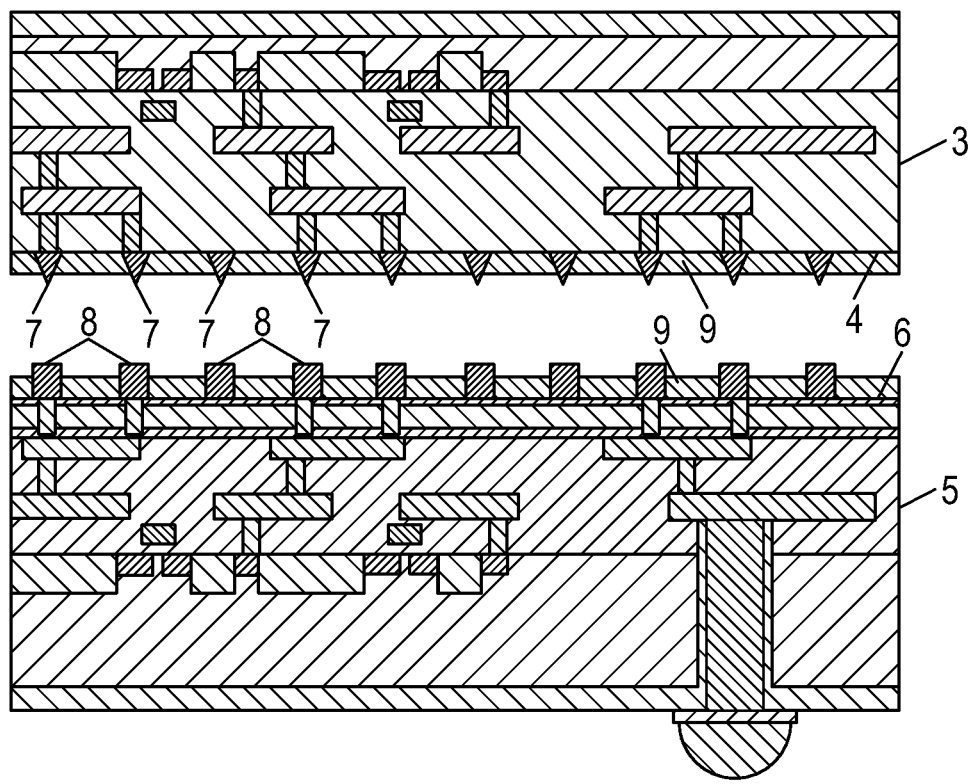
FIG. 3 is a cross sectional view of a semiconductor package implementation having blade interconnects prior to bonding.

Referring now to FIG. 3, a cross sectional view of a semiconductor package with blade interconnects prior to bonding is shown. In this implementation, the semiconductor package includes a first wafer 3 with a first surface 4 and a second wafer 5 with a first surface 6. A first set of blade interconnects 7 is shown extending from the first surface 4 of the first wafer 3, and a second set of blade interconnects 8 is shown extending from the first surface of the second wafer. In the implementation illustrated in FIG. 3, an underfill material 9 is disposed between or located between the blade interconnects of the first set of blade interconnects 7 and the blade interconnects of the second set of blade interconnects 8. The underfill material 9 may be placed there before the wafers are bonded or after the wafers are bonded and may be placed using coating, application of dry film materials, or any other dispensing process. The underfill material 9 may include, by any non-limiting example, an epoxy, silicon-containing compound, silicone, or any combination thereof.

Figure 4:
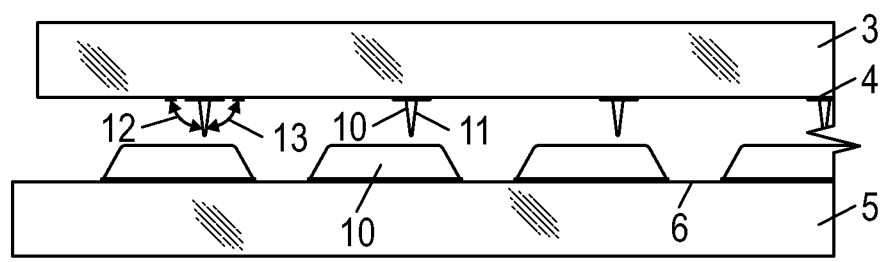
FIG. 4 is a magnified view of the implementation of FIG. 3 showing the wafers and blade interconnects.

Referring now to FIG. 4, a magnified view of FIG. 3 showing the wafers and blade interconnects is illustrated. Each blade interconnect of the first set of blade interconnects and of the second set of blade interconnects has a first sidewall 10 and a second sidewall 11 on an opposing side of the interconnect from the first sidewall. The first sidewall 10 is oriented at an angle 12 from the first surface 4 of one of the first wafer 3 for those blade interconnects in the first set of blade interconnects. This angle 12 may be between about 90 degrees and about 170 degrees. The first sidewall 10 of the second set of blade interconnects is also oriented at an angle from the first surface 6 of the second wafer 5 of between about 90 degrees and about 170 degrees. Likewise, the second sidewall 11 is oriented at an angle 13 from the first surface of the first wafer between about 90 degrees and about 170 degrees and the second sidewall 11 is also oriented at an angle from the first surface 6 of the second wafer 5 at an angle between about 90 degrees and about 170 degrees.

The blade interconnects may be made of any metal or metal alloy including, by non-limiting example, copper, gold, tin, nickel, lead, aluminum, silver, indium, any combination of the foregoing, or any combination of alloys of the foregoing. The first and second sets of blade interconnects in various implementations may have a single metal or metal alloy layer or may have multiple layers of metals, metal alloys, or both.

The blade interconnects may be of a wide variety of sizes in various implementations. In particular implementations, the blade pitch is 2 um, the blade length is 1 um, the blade width is 0.1 um, and the blade height is 0.2 um. In this implementation, the sizes of the blade interconnects of the first set of blade interconnects and the blade interconnects of the second set of blade interconnects are the same. In others, however, the sizes of the interconnects between the two sets may differ. In particular implementations, the sizes of the blade interconnects within each set may differ.

Figure 5:
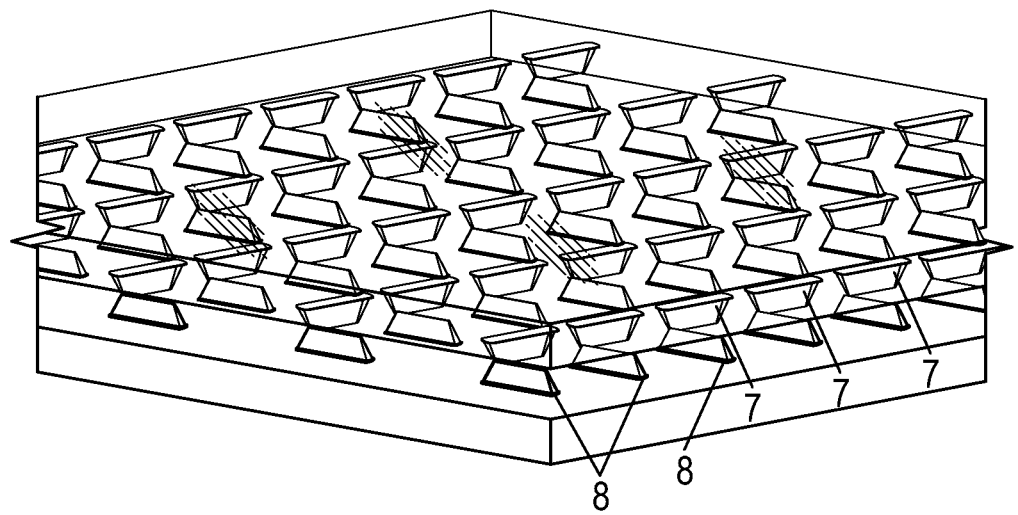
FIG. 5 is a partial see through view of two wafers with sets of implementations of intersecting blade interconnects.

Referring now to FIG. 5, a view of two wafers with intersecting sets of blade interconnects viewed through a partially transparent upper wafer is illustrated. As illustrated, the second set of blade interconnects 8 is oriented substantially perpendicular to a direction of orientation of the first set of blade interconnects 7. This is clearly illustrated in FIG. 7, an illustration of a top view of the wafers of FIG. 5 when bonded in partial see through illustrating the intersecting blade interconnects. In some implementations, not every blade interconnect of the first set of blade interconnects 7 will have a corresponding blade interconnect of the second set of blade interconnects 8 to bond with, and vice versa. In other implementations, every blade interconnect within the first set of blade interconnects 7 does have a corresponding blade interconnect of the second set of blade interconnects 8 to bond with. The blade interconnects of the first set of blade interconnects 7 may or may not vary in size within the set, and the blade interconnects of the second set of blade interconnects 8 may or may not vary in size within the set.

Figure 6:
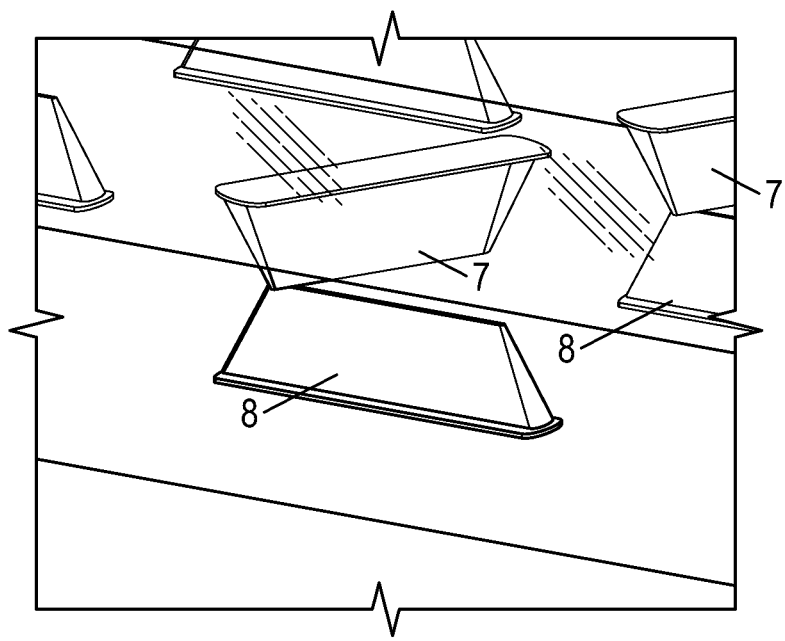
FIG. 6 is a partial see through magnified view of the intersecting blade interconnects of FIG. 5.

FIG. 6 illustrates a magnified view of the intersecting blade interconnects of FIG. 5. The first set of blade interconnects 7 are hybrid bonded to the second set of blade interconnects 8 at a plurality of points of intersection between the first set and second set of blade interconnects. The points of intersection are located along a length of each blade interconnect of the first set of blade interconnects 7, and are located along the length of each blade interconnect of the second set of blade interconnects 8. Since the point of intersection for a given pair of blade interconnects can exist potentially anywhere along the length of each interconnect, the alignment accuracy (X, Y, and rotation) requirements for successfully bonding the wafers together become more relaxed, which may create higher yield. The hybrid bond is commonly accomplished through thermocompression bonding, though other hybrid bonding alternatives may also be used.

Figure 7:
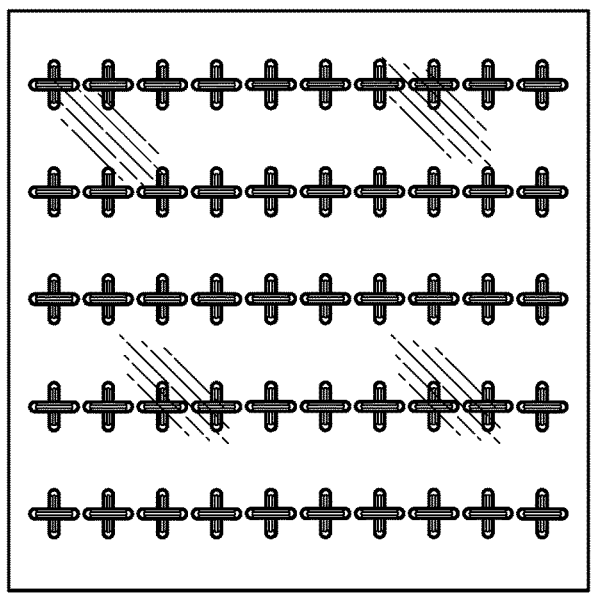
FIG. 7 is a top cross sectional see through view of bonded wafers showing the sets of intersecting blade interconnects.

FIG. 7 illustrates the intersecting blade interconnects forming plus signs, however, in various implementations the intersecting blade interconnects may be rotated any number of degrees. In one possible implementation, the intersecting blade interconnects are rotated approximately 45 degrees to form X patterns. Further, FIG. 7 illustrates all the blade interconnects of the first set of blade interconnects arranged in the same position at different locations on the first wafer and all the blade interconnects of the second set of blade interconnects are arranged in the same position at different locations on the second wafer. In various implementations, the blade interconnects of the first set of blade interconnects may be arranged in alternating or different positions and the blade interconnects of the second set of blade interconnects may be oriented substantially perpendicular to a direction of orientation of the blade interconnects of the first set of blade interconnects. In other implementations, the blade interconnects may be oriented non-perpendicularly to each other at varying angles from about 20 degrees to about 160 degrees relative to each other.

The area of the bond at the point of intersection between intersecting blade interconnects varies with the angle of the blade interconnects and the depth of penetration between the intersecting blade interconnects into each other. Thus, if a certain contact area is required between the first and second set of intersecting blade interconnects, the penetration depth of the intersecting blades, the width of the blades, and the angle of the leading edge of the blade interconnects can be adjusted during design and/or fabrication to achieve the desired bond area between intersecting blade interconnects.

Figure 8:
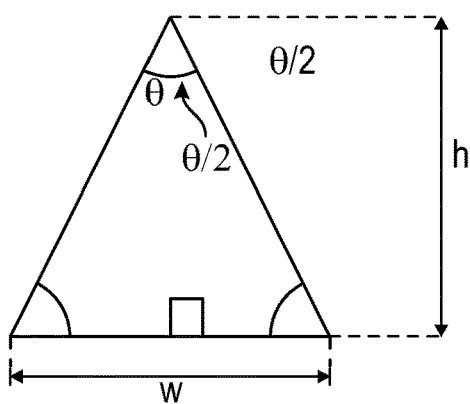
FIG. 8 is a diagram of a side view of a blade interconnect used to calculate a blade intersect area.
Figure 9:
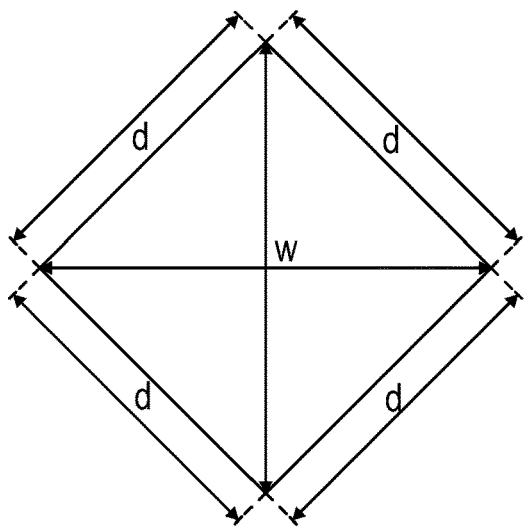
FIG. 9 is a diagram of a side view of an area of intersection between two blade interconnects used to calculate the blade intersect area.

FIGS. 8 and 9 are diagrams that can be used to approximately calculate the bond area for each pair of substantially perpendicular intersecting blade interconnects. Referring specifically to FIG. 8, a cross section of the intersecting portion of a blade interconnect is shown. Variable h represents the depth of the penetration, w represents the width of the blade at the base of the penetrating portion of the blade interconnect, and θ represents the angle of the blade at the leading edge. Using trigonometric functions, equation 1 yields:

$$\tan(\theta/2) = \frac{w/2}{h} \qquad \text{Eq. 1}$$

Rearranging Equation 1 to solve for w yields Equation 2.

$$\tan(\theta/2) \cdot (2h) = w \qquad \text{Eq. 2}$$

Referring specifically to FIG. 9, a cross sectional view of intersecting blade interconnects showing the contact area is illustrated. Equations 3 and 4 are then derived using the Pythagorean theorem.

$$d^2 = \left(\frac{w}{2}\right)^2 + \left(\frac{w}{2}\right)^2 \qquad \text{Eq. 3}$$

$$d^2 = \frac{2w^2}{4} = \frac{w^2}{2} \qquad \text{Eq. 4}$$

The area is found by calculating $d^2$ through substituting the value for w calculated in Eq. 2, yielding Equations 5 and 6.

$$\text{Area} = d^2 = \frac{w^2}{2} = \frac{[2h\tan(\theta/2)]^2}{2} \qquad \text{Eq. 5}$$

$$\text{Area} = 2h^2 \left(\tan\left(\frac{\theta}{2}\right)\right)^2 \qquad \text{Eq. 6}$$

Figure 10:
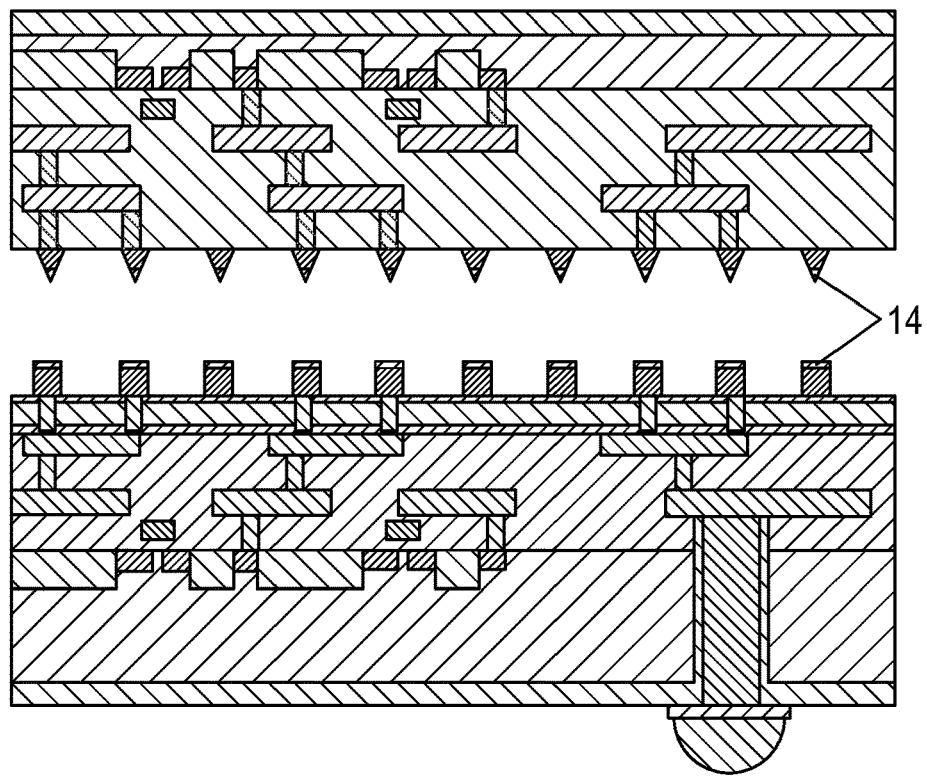
FIG. 10 is a cross sectional view of a semiconductor package with blade interconnects having a layer of solder prior to bonding.

Referring now to FIG. 10, a cross sectional view of a semiconductor package with blade interconnects with a layer of solder prior to bonding is illustrated. In an alternative implementation, a layer of solder 14 may be applied to the surfaces of the blade interconnects of the first set of blade interconnects 7, the surfaces of the second set of blade interconnects 8, or to the surfaces of both the first and the second set of blade interconnects. The solder may cover any portion of the blade interconnects. The solder layer may be, by non-limiting example, a tin based solder, a lead tin based solder, or a lead free solder. An underfill material may be placed between the blade interconnects of the first set of blade interconnects and the blade interconnects of the second set of blade interconnects. Where such an underfill material is present, the solder reduces the risk of the underfill becoming incorporated at the solder joints. In other embodiments, however, no underfill material is used The solder covered blade interconnects may be of a wide variety of sizes in various implementations. In a particular implementation, the blade pitch is 50 um, the blade length is 25 um, the blade width is 2.5 um, and the blade height is 5 um.

Figure 11:
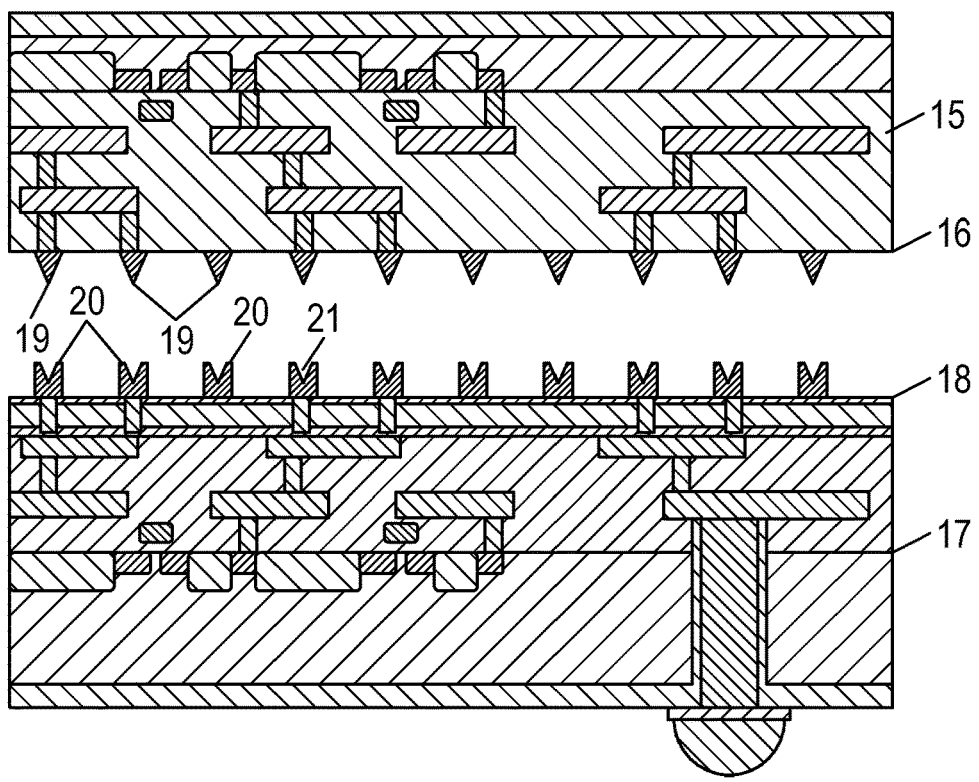
FIG. 11 is a cross sectional view of a semiconductor package with a set of chamfered blade interconnects prior to bonding.
Figure 13:
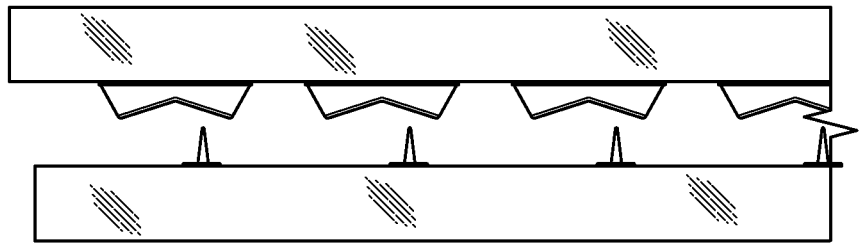
FIG. 13 is a magnified view of the blade interconnects of FIG. 11 with the upper blade interconnects chamfered.

Referring now to FIG. 11, a cross sectional view of a semiconductor package with chamfered blade interconnects prior to bonding is illustrated. Chamfered blade interconnects provide for increased self-aligning of the blade interconnects between the wafers during the alignment and/or bonding process. The implementation illustrated has a first wafer 15 with a first surface 16 and a second wafer 17 with a first surface 18. A first set of blade interconnects 19 is shown extending from the first surface 16 of the first wafer 15, and a second set of blade interconnects 20 is shown extending from the first surface 18 of the second wafer 17. The blade interconnects of the second set of blade interconnects 20 each include a chamfer 21. While in this implementation, the second set of blade interconnects 20 are chamfered, the blade interconnects of the first set of blade interconnects 19 could be chamfered rather than the blade interconnects of the second set of blade interconnects 20, as is illustrated in FIG. 13. In still another implementations, both the first and second set of blade interconnects could be chamfered in corresponding ways.

Figure 12:
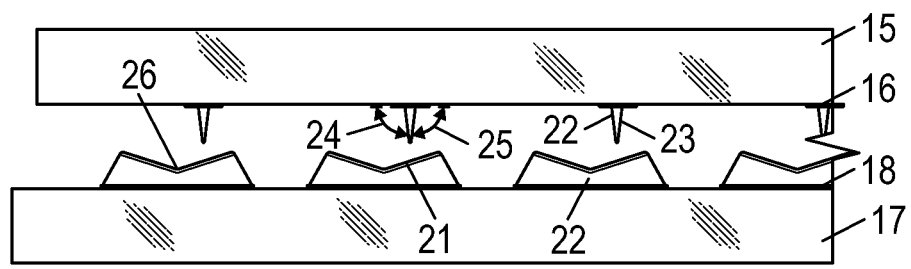
FIG. 12 is a magnified view of the blade interconnects of FIG. 11 with the lower blade interconnects chamfered.

Referring now to FIG. 12, a magnified view illustrating the wafers and blade interconnects is illustrated. In the present implementation, each chamfer 21 of a blade interconnect covers the entire edge of each blade. In other implementations, however, the chamfer covers only a portion of the edge of each blade interconnect. In the implementations illustrated, the deepest portion of the chamfer 26 is in the center of the chamfer. In other implementations, however, the deepest portion 26 of the chamfer may be off center. In particular implementations, the chamfer may not be centered in the structure of the blade interconnect but may be off-center.

Each blade interconnect of the first set of blade interconnects 19 and of the second set of blade interconnects 20 may be formed consistent with a structure like any of those disclosed in this document, other than for the presence of the chamfer in the structure of the blade interconnect. They may also be sized like any disclosed in this document.

Like the first and second sets of blade interconnects previously disclosed, the second set of blade interconnects 20 is oriented substantially perpendicular to a direction of orientation of the first set of blade interconnects 19. In some implementations, not every blade interconnect within the first set of blade interconnects 19 will have a corresponding blade interconnect within the second set of blade interconnects 20 and vice versa. In other embodiments, every blade interconnect within the first set of blade interconnects 19 does have a corresponding blade interconnect within the second set of blade interconnects 20. The sizes of the various blade interconnects within each set may vary in any of the ways disclosed herein.

Like those previously discussed in this document, the first set of blade interconnects 19 are hybrid bonded to the second set of blade interconnects 20 at a plurality of points of intersection between the first set of blade interconnects 19 and the chamfers 21 of the second set of blade interconnects 20. The points of intersection may be at any point along a length of each blade interconnect of the first set of blade interconnects 19, and are located at any point within the chamfer 21 of each blade interconnect of the second set of blade interconnects 20. During the bonding/aligning process, however, because of the presence of the chamfer, the first set of blade interconnects 19 will tend to slide down toward the bottom of the chamfers 21, thereby centering the blade interconnects within the material of the second set of blade interconnects. This self-aligning feature of the chamfer may reduce the requirement that the bonder be as careful to align the wafers. Furthermore, it may reduce the need for the use of numerous wafer alignment structures to be included among the various blade interconnects, which may permit tighter packing of die on the wafer. Accordingly, the use of chamfers may both increase yield and total die per wafer as well.

As previously discussed in this document, an underfill material may be deposited between the blade interconnects of the first set of blade interconnects 19 and the blade interconnects of the chamfered second set of blade interconnects 20. The underfill dispense process may be any disclosed in this document and the underfill material may be any disclosed in this document. Similarly, a layer of solder may be applied to the sets of blade interconnects as previously disclosed and the solder material may be any disclosed in this document.

Referring now to FIGS. 14-19, an implementation of a method of forming a chamfered blade interconnect is illustrated through showing the structures formed at intermediate processing steps.

Figure 14:
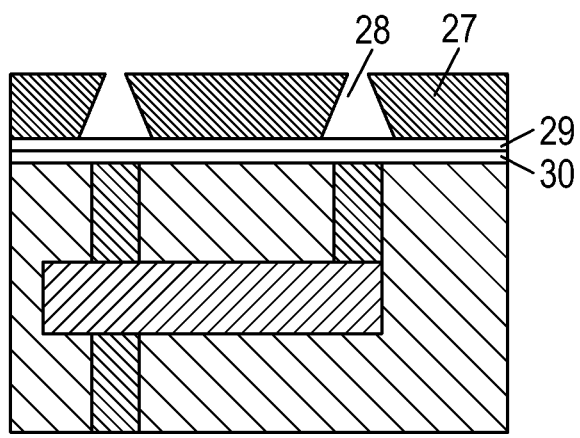
FIG. 14 is a cross sectional view of a wafer with an undercut photoresist pattern formed in a photoresist layer.

Referring specifically to FIG. 14, a cross sectional view of a wafer with an undercut photoresist pattern formed in a photoresist layer is shown. An undercut photoresist pattern 28 is formed in a photoresist layer 27 on a first surface of a first wafer and on a first surface of a second wafer. In such implementations, the triangular undercut photoresist pattern becomes wider the closer it is to the wafer as shown in FIG. 14. Such a pattern can be made by a variety of processing techniques, including, by non-limiting example, exposing the undercut photoresist resist pattern out of focus, overexposing the undercut photoresist pattern, overdeveloping the undercut photoresist pattern, including a highly reflective surface under the photoresist material, or through using a multilayer resist method where the bottom layer of the undercut photoresist pattern reacts with the light much faster than the top layer, and the like. In some implementations, a seed layer 29 and diffusion barrier 30 deposited between the photoresist layer and the wafer.

Figure 15:
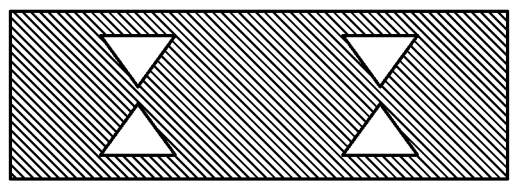
FIG. 15 is a top view of the undercut photoresist pattern of FIG. 14 formed in the photoresist layer.
Figure 16:
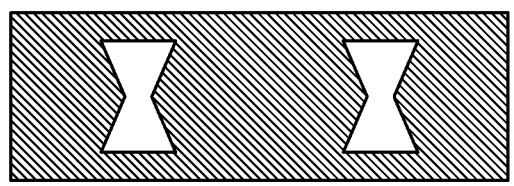
FIG. 16 is a top view of an alternative undercut photoresist pattern formed in a photoresist layer.

Referring now to FIGS. 15 and 16, top views of two implementations of undercut photoresist patterns are shown.

In one implementation illustrated in FIG. 15, the openings in the top surface of the undercut photoresist pattern are two opposing triangles when viewed from above. The triangles can have sharp vertices, though in most embodiments the vertices of the triangle will be rounded due to the exposure/develop process.

Referring now to FIG. 16, another implementation of the undercut photoresist layer is illustrated in top view. In this embodiment, the opening formed in the top surface of the photoresist layer has an hour glass shape when viewed from above. The hourglass shape can have sharp edges, though in most embodiments the edges of the hourglass will be rounded. This hourglass shape is similar to the two triangle version, except that the two triangles were allowed to merge together into a single opening rather than two openings in the top surface of the photoresist layer. The implementations of FIGS. 15 and 16 can be formed through use of triangularly shaped patterns formed on reticles that are either joined or unjoined, depending on the exposure/development settings of the photolithographic process itself.

Figure 17:
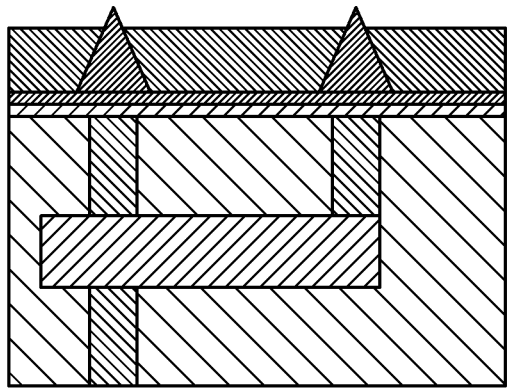
FIG. 17 is a cross sectional view of the wafer of FIG. 14 with blade interconnects filling the undercut of the photoresist layer.

Referring now to FIG. 17, a view of FIG. 14 with blade interconnects electroplated into the undercut pattern of the photoresist layer is illustrated. The undercut photoresist layer becomes filled during the metal deposition process with the material of the blade interconnects. The blade interconnects may be formed of any material disclosed in this document, and deposited using any process designed to fill the undercut photoresist pattern. In various implementations a seed layer is deposited and used as part of the material deposition process. In particular implementations, the undercut photoresist pattern opening is filled through an electroplating/electroless plating process. As a result of the unique triangular or hourglass undercut photoresist pattern, The resulting blade interconnect will be chamfered as the photoresist in the center of the pattern opening will prevent/inhibit the deposition process into the opening and for the shape of the chamfer.

Figure 18:
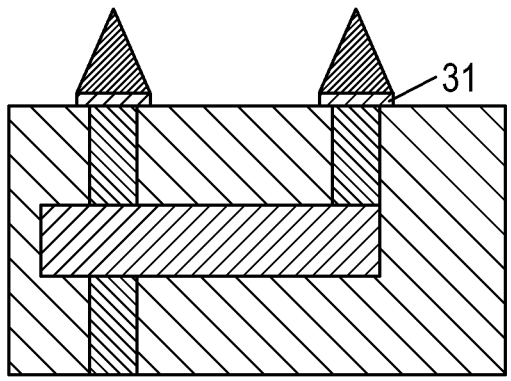
FIG. 18 is a cross sectional view of the wafer of FIG. 17 with the photoresist layer removed.

Referring now to FIG. 18, a side cross section view of FIG. 17 with the photoresist layer removed is illustrated. Upon formation of the blade interconnects, the remaining photoresist layer is removed. If there was a seed layer and diffusion barrier applied to the wafer, those may also be removed via etching with the exception of the portion of the diffusion barrier 31 directly under the blade interconnects.

Figure 19:
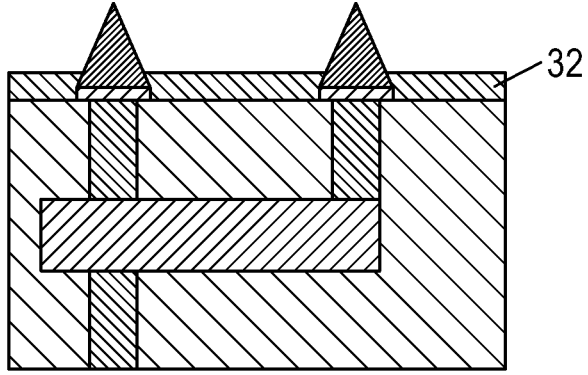
FIG. 19 is a cross sectional view of the wafer FIG. 18 with underfill material applied thereto.

Referring now to FIG. 19, a view of FIG. 18 with applied underfill material present is illustrated. In this implementation, the underfill material 32 may be any disclosed in this document, using any method disclosed herein.

In places where the description above refers to particular implementations of bonded semiconductor packages, blade interconnects, and implementing components, sub-components, methods and sub-methods, it should be readily apparent that a number of modifications may be made without departing from the spirit thereof and that these implementations, implementing components, sub-components, methods and sub-methods may be applied to other bonded semiconductor packages and blade interconnects.

What is claimed is:

1. A semiconductor package comprising:
a first wafer having a first surface;
a first set of blade interconnects coupled to the first surface of the first wafer, the first set of blade interconnects extending from the first surface;
a second wafer having a first surface; and
a second set of blade interconnects coupled to the first surface of the second wafer, the second set of blade interconnects extending from the first surface and oriented substantially perpendicularly to a direction of orientation of the first set of blade interconnects;
wherein the first set of blade interconnects is hybrid bonded to the second set of blade interconnects at a plurality of points of intersection between the first set and second set of blade interconnects; and
wherein the plurality of points of intersection are located along a length of each blade interconnect of the first set of blade interconnects, and are located along the length of each blade interconnect of the second set of blade interconnects.

2. The semiconductor package of claim 1, wherein the first set of blade interconnects and the second set of blade interconnects comprise one of a metal and a metal alloy.

3. The semiconductor package of claim 1, wherein the first set of blade interconnects and second set of blade interconnects each comprise a solder layer thereon.

4. The semiconductor package of claim 1, further comprising an underfill material disposed between the blade interconnects of the first set of blade interconnects.

5. The semiconductor package of claim 1, further comprising an underfill material disposed between the blade interconnects of the second set of blade interconnects.

6. The semiconductor package of claim 1, wherein each blade interconnect of the first set of blade interconnects and of the second set of blade interconnects comprises a first sidewall and a second sidewall opposite the first sidewall; and
wherein the first sidewall comprises an angle from the first surface of one of the first wafer and the second wafer of between 90 degrees and 170 degrees and the second sidewall comprises an angle from the first surface of one of the first wafer and the second wafer of between 90 degrees and 170 degrees.

7. The semiconductor package of claim 1, wherein at least one blade interconnect of the first set of blade interconnects is not the same size as the other blade interconnects of the first set of blade interconnects.

8. The semiconductor package of claim 1, wherein at least one blade interconnect of the second set of blade interconnects is not the same size as the other blade interconnects of the second set of blade interconnects.

9. The semiconductor package of claim 1, wherein not every blade interconnect of the first set of blade interconnects has a corresponding blade interconnect of the second set of blade interconnects.

10. A semiconductor package comprising:
a first wafer having a first surface;
a first set of blade interconnects coupled to the first surface of the first wafer, the first set of blade interconnects extending away from the first surface;
a second wafer having a first surface; and
a second set of blade interconnects coupled to a first surface of the second wafer, the second set of blade interconnects extending away from the first surface and oriented substantially perpendicularly to a direction of orientation of the first set of blade interconnects;
wherein each blade interconnect of the second set of blade interconnects comprises a chamfer therein;
wherein the first set of blade interconnects are hybrid bonded to the second set of blade interconnects at a plurality of points of intersection between the first set of blade interconnects and the chamfer of each blade of the second set of blade interconnects; and
wherein the plurality of points of intersection are located along a length of each blade interconnect of the first set of blade interconnects, and are located within the chamfer of each blade interconnect of the second set of blade interconnects.

11. The semiconductor package of claim 10, wherein the first set of blade interconnects and second set of blade interconnects comprise one of a metal and a metal alloy.

12. The semiconductor package of claim 10, wherein the first set of blade interconnects and the second set of blade interconnects comprise a solder layer thereon.

13. The semiconductor package of claim 10, further comprising one of an underfill material disposed between the blade interconnects of the first set of blade interconnects and an underfill material disposed between the blade interconnects of the second set of blade interconnects.

14. The semiconductor package of claim 10, wherein each blade interconnect of the first set of blade interconnects and of the second set of blade interconnects comprises a first sidewall and a second sidewall opposite the first sidewall; and wherein the first sidewall comprises an angle from the first surface of one of the first wafer and the second wafer of between 90 degrees and 170 degrees and the second sidewall comprises an angle from the first surface of one of the first wafer and the second wafer of between 90 degrees and 170 degrees.

15. The semiconductor package of claim 10, wherein at least one blade interconnect of the first set of blade interconnects is not the same size as the other blade interconnects of the first set of blade interconnects.

16. The semiconductor package of claim 10, wherein at least one blade interconnect of the second set of blade interconnects is not the same size as the other blade interconnects of the second set of blade interconnects.

17. The semiconductor package of claim 10, wherein not every blade interconnect of the first set of blade interconnects has a corresponding blade interconnect of the second set of blade interconnects.

18. A semiconductor package comprising:
a first wafer having a first surface;
a first set of blade interconnects coupled to the first surface of the first wafer, the first set of blade interconnects extending from the first surface;
a second wafer having a first surface; and
a second set of blade interconnects coupled to the first surface of the second wafer, the second set of blade interconnects extending from the first surface and oriented substantially perpendicularly to a direction of orientation of the first set of blade interconnects;
wherein the first set of blade interconnects is hybrid bonded to the second set of blade interconnects at a plurality of points of intersection between the first set and second set of blade interconnects; and
wherein a length of each blade interconnect at an intersecting edge of each blade interconnect is greater than a width of each blade interconnect at the intersecting edge of each blade interconnect.

19. The semiconductor package of claim 18, wherein a length of each blade interconnect of the first set of blade interconnects extends across an entire width of each blade interconnect of the second set of blade interconnects and a length of each blade interconnect of the second set of blade interconnects extends across an entire width of each blade interconnect of the first set of blade interconnects.

20. The semiconductor package of claim 18, wherein a width of a base of each blade interconnect is wider than width of the intersecting edge of each blade interconnect.

* * * * *